United States Patent

[11] 3,634,161

[72] Inventors Rigobert Schimmer; Horst Gesing, both of Belecke, Germany

[21] Appl. No. 748,032
[22] Filed July 26, 1968
[45] Patented Jan. 11, 1972
[73] Assignee Licentia Patent-Verwaltungs-GmbH Frankfurt am Main, Germany
[32] Priority July 26, 1967
[33] Germany
[31] L 57069

[54] METHOD OF DIVIDING SEMICONDUCTOR WAFERS
4 Claims, 8 Drawing Figs.

[52] U.S. Cl. .......... 156/17, 156/13
[51] Int. Cl. .......... H01l 7/00, H01l 7/50
[50] Field of Search .......... 156/13, 17, 11

[56] References Cited

UNITED STATES PATENTS

| | | | |
|---|---|---|---|
| 1,862,231 | 6/1932 | McFarland | 156/13 X |
| 3,046,176 | 7/1962 | Bosenberg | 156/11 |
| 3,288,662 | 11/1966 | Weisberg | 156/11 |
| 3,432,919 | 3/1969 | Rosvold | 29/578 |

*Primary Examiner*—Jacob H. Steinberg
*Attorney*—Spencer & Kaye

ABSTRACT: A method of dividing semiconductor wafers, wherein a masking layer is applied to a surface of the semiconductor wafer and the wafer is cut by means of an etching solution applied to the masked surface. The method includes the step of vaporizing a metal layer consisting of chromium onto the semiconductor wafer to form the masking layer.

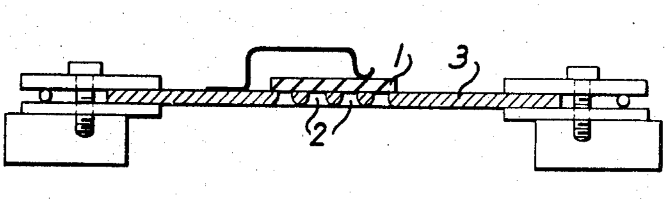
Fig. 1
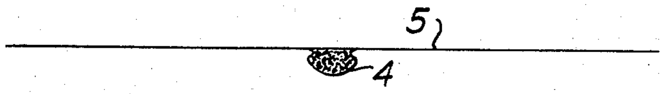
Fig. 2
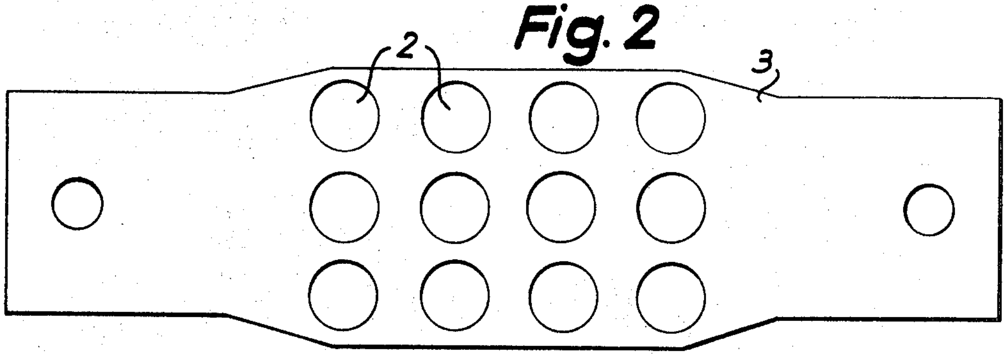
Fig. 3
Fig. 4
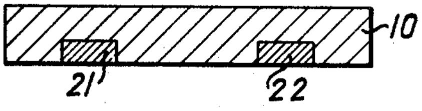
Fig. 5
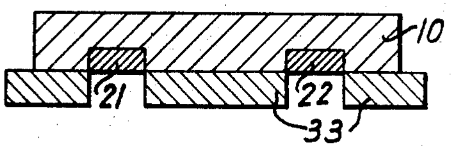
Fig. 6
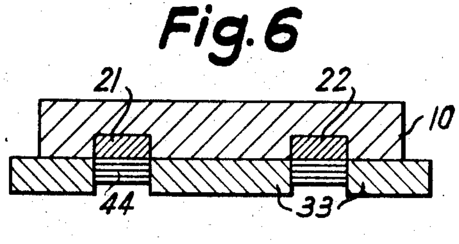
Fig. 7
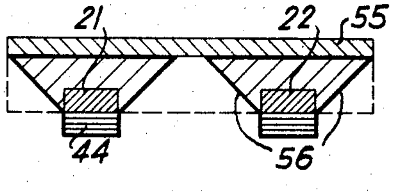
Fig. 8
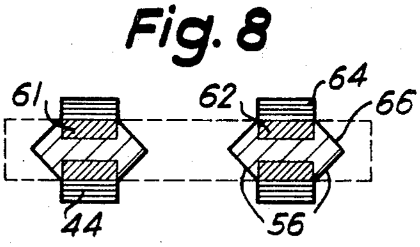
Inventors:
Rigobert Schimmer
Horst Gesing
By: Spencer & Kaye
Attorneys

METHOD OF DIVIDING SEMICONDUCTOR WAFERS

BACKGROUND OF THE INVENTION

The present invention relates to a method of dividing semiconductor wafers in particular, wafers of silicon, germanium or compounds of elements from groups III*a* and V*a* of the periodic table to form separate semiconductor elements or devices.

When manufacturing semiconductor devices such as diodes, thyristors and triacs, small constructional elements are normally separated from a larger semiconductor "wafer," which, for example, may be made of silicon, after the wafer has been covered with metallic layers, such as layers of nickel, copper, silver or gold, to facilitate the contacting of semiconductor devices. These constructional elements may be separated by a number of different processes: the processes generally used involve ultrasonic drilling, cutting with a grate, sand blasting, scoring and breaking as well as chemical etching. The latter, chemical means of dividing the semiconductors wafer has proven advantageous in practice especially when the constructional elements are to have complicated geometric measurements.

In order to give the small semiconductors constructional elements a particular geometric form when cut, by etching, from a larger wafer, the wafer is first covered with a mask which exposes only those places which are to be attacked by the etching fluid. The mask may be applied directly to the wafer as a coating or layer by screen printing, spraying, or by the photo resist technique. This coating is made of a material which is at least partially resistant to the etching fluid, such as photo resist material or a cementing lacquer of the type known as "picein," which is a reversible, thermoplastic cement commercially obtainable, for example, from Carl Roth OHG, 75 Karlsruhe-West, Schoenperlenstr. 3, West Germany; Dr. Theodor Schuchardt, 8 Munich 13, Post Office Box 370, West Germany, or New York, Hamburger Gummiwaren Co., 2 Hamburg 33, Hufnerstr. 30, West Germany. Masking tape has also been used on occasion to cover the semiconductor wafer.

All covering layers that have been used in the prior art have the disadvantage, however, of exhibiting resistance to the etching agents used for cutting wafers for only a limited length of time. At the high-etching temperatures and the extended etching times which are necessary to etch through a semiconductor wafer, the masking layer is also attacked by the etching agent, especially at its edges. As a result, there is a decrease in the accuracy of size and an increased reject quota of the chemically separated semiconductor elements.

SUMMARY OF THE INVENTION

An object of the present invention, therefore, is to improve the method of cutting a semiconductor wafer with an etching solution to avoid the disadvantages of the prior art described above.

This, as well as other objects which will become apparent in the discussion that follows, is achieved, according to the present invention, by evaporating a metal layer consisting of chromium onto the semiconductor to form the masking layer.

A chromium metal layer is distinguished by its improved resistance to an etching agent, in particular, at the high temperatures required for cutting semiconductor wafers. The use of a chromium metal layer prevents a change in the geometric form of the mask during the etching process. Since even the edges of the masking layer will then not be removed, the present invention insures high-dimensional accuracy for the semiconductor elements etched from the wafer and results in a lower reject quota.

Because metal layers are normally applied to the semiconductor wafer by evaporation to provide contacts for the semiconductor elements, the vaporization of an additional chromium metal cover layer will require a minimum of labor. The application of this additional metal layer also eliminates a further mask adjustment step which is required with the processes of the prior art and obviates the possibility of adjustment error.

Chromium, which has a passivation tendency, has proven especially suitable as the masking layer according to the present invention, since tests have shown, for example, that chromium layers are substantially superior to layers of gold or lead.

After the semiconductor wafer is divided into the semiconductor elements by etching, the chromium metal masking layer, according to the present invention, may be easily removed, if necessary, in dilute hydrochloric acid by activating, for example, with zinc. By proper selection of the fluid, it is possible to remove the chromium masking layer without attacking the other metal layers e.g. of gold, which were vaporized onto the semiconductor elements to provide electrical contact.

BRIEF DESCRIPTION OF THE DRAWINGS

FIG. 1 is a cross-sectional view of a typical evaporation system which may be used to carry out the method of the present invention.

FIG. 2 is a top view of the mask employed with the apparatus of FIG. 1.

FIG. 3 is a cross-sectional view of a section of a semiconductor wafer. This wafer is used as the starting material in the manufacture of semiconductor elements.

FIG. 4 is a cross-sectional view of a semiconductor wafer showing two semiconductor elements in a first stage of manufacture.

FIG. 5 is a cross-sectional view of a semiconductor wafer and a evaporation mask showing two semiconductor elements in a second stage of manufacture.

FIG. 6 is a cross-sectional view of a semiconductor wafer and an evaporation mask showing two semiconductor elements in a third stage of manufacture.

FIG. 7 is a cross-sectional view of two semiconductor elements in a final stage of manufacture.

FIG. 8 is a cross-sectional view of two semiconductor elements in another alternate final stage of manufacture.

DESCRIPTION OF THE PREFERRED EMBODIMENTS

Referring now to the drawings, FIG. 1 illustrates a typical vacuum system which may be used for the evaporation of a metal onto a semiconductor wafer, according to the method of the present invention. There is shown a wafer 1, which, for example, may be made of silicon, disposed on a steel mask 3. Below the semiconductor wafer 1 and the mask 3, there is arranged a tungsten filament 5 provided with a charge of chromium 4, ready for evaporation.

FIG. 2 shows the mask 3 in top view. As may be seen, the mask is provided with openings 2 which permit the metal vapor to reach selected portions of the semiconductor wafer 1. These openings may be round, as shown, or any other shape depending on the desired configuration of the semiconductor elements cut from the wafer 1. The shape of the openings 2 determines the shape of the semiconductor elements.

The apparatus illustrated in FIGS. 1 and 2 is operated in the following manner. After the air surrounding the apparatus has been evacuated, the wafer 1 is heated to the desired operating, temperature by passing a current through the mask 3. The chromium charge 4 is then brought to the evaporation temperature by passing current through the filament 5. A shield, not shown, is initially interposed between the charge and the mask to intercept any contaminants on the surface of the metal charge 4 which evaporate before the charge does.

After the surface contaminants have been removed, the shield is moved out of position and the evaporation is allowed to proceed. After a coating of the desired thickness is achieved, the shield is again moved into position and the silicon wafer 1 allowed to cool.

FIGS. 3 to 8 illustrate a series of stages of manufacture, according to the present invention, for two semiconductor elements. Like FIGS. 1 and 2, these FIGURES are representational diagrams only and are not drawn to scale.

FIG. 3 shows the semiconductor wafer 10 which is the starting material for the manufacture of the semiconductor elements. This wafer may be made, for example, of silicon.

Dopant material is first diffused into the semiconductor wafer at a number of places to give these places a certain desired conductivity type. Two such doped regions 21 and 22 are shown in FIG. 4.

The semiconductor wafer is then placed on a mask in evaporation apparatus of the type shown in FIGS. 1 and 2. As is illustrated in FIG. 5, the openings in the mask 33 are aligned with the doped regions 21 and 22 of the semiconductor wafer 10; that is, the regions in which the conductivity type of the wafer has been changed.

A series of metal layers 44 are next vaporized onto the regions 21 and 22 through the openings in the mask 33. These metal layers, which will later serve as electrical contacts for the semiconductor elements, may also be applied by some other process known in the art. It is possible, for example, to apply a series of layers, beginning with the layer nearest the semiconductor wafer, consisting of chromium, nickel and gold or nickel, silver and gold. Other series of metal layers which include, for example, copper have also proven effective. In the case of the chromium, nickel and gold series, the chromium layer which lies next to the semiconductor body may be made about 0.1 $\mu$m. thick while each of the other layers may be applied with a thickness of about 0.5 to 2 $\mu$m.

After the application of these series of metal layers, a layer of chromium, with a thickness of between 0.5 to 1 $\mu$m., is evaporated through the mask 33 in a high vacuum, preferably at about $10^{-5}$ Torr. By way of example, a measured charge of approximately 3 grams may be vaporized from a tungsten vessel onto a plane disc approximately 50 millimeters in diameter. The temperature of the tungsten vessel is chosen so that the chromium is not quite melted, but exhibits sufficient sumlimation to carry out the process.

Under these conditions a layer thickness of 0.5 to 1 $\mu$m. will be obtained with an evaporation time of about 30 minutes. If the chromium is not heated by purely thermal processes, but is applied under other conditions, for example, with a high-power electron gun, thicker layers may be produced in considerably shorter time.

The semiconductor wafer 10 can now be turned over and treated on its opposite side. It is possible, for example, to repeat the steps illustrated in FIGS. 4, 5 and 6 to produce doped regions 61 and 62 covered with a plurality of metal layers 64 arranged thereon, directly opposite the doped regions 21 and 22, as shown in FIG. 8. The backside of the semiconductor wafer 10 can also be covered with a solderable metal layer 55, as shown in FIG. 7. This metal layer 55 can be evaporated onto the wafer with or without the use of a mask.

After the necessary metal layers have been applied to the semiconductor structure, the wafer is removed from the mask 33 and etched by placing it in acid under agitation. An acid mixture which has proven satisfactory as an etching agent may be made of hydrofluoric acid, nitric acid and acetic acid. The mixture may be advantageously formed from one part by volume of hydrofluoric acid, one part by volume of nitric acid and two parts by volume of acetic acid.

The etching process separates the larger semiconductor wafer into smaller individual constructional elements, along the lines 56 and 66, as shown in FIGS. 7 and 8. Due to the application of the method according to the present invention, these smaller elements will be extremely accurate in size. If one side of the semiconductor wafer has been covered with the solderable layer 55, as shown in FIG. 7, the edges 56 will define a cone-shaped semiconductor element. If the acid is allowed to etch away the semiconductor wafer from both sides thereof, the semiconductor elements will assume the shape shown in FIG. 8.

After the semiconductor wafer has been separated into the individual semiconductor elements, the chromium masking layer may be removed in hydrochloric acid. This hydrochloric acid may be advantageously formed from a mixture of 80 parts by volume of fuming hydrochloric acid and 20 parts by volume of water. If other concentrations of hydrochloric acid are used, the chromium must be activated by contact with a bar of zinc; because of its inertness, the chromium will otherwise not be attacked by the hydrochloric acid.

Although reference to silicon has been made in the example above of the division of a semiconductor wafer, the method, according to the present invention, may also be advantageously employed with the other materials which are commonly used in the semiconductor art. For example, the semiconductor wafers may be made of germanium or compounds, such as indium antimonide or gallium arsenide, taken from the elements of groups III*a* and V*a* of the periodic table.

It will be understood that the above description of the present invention is susceptible to various modifications, changes and adaptations.

We claim:

1. In a method of dividing semiconductor wafers, wherein a masking layer is applied to selected portions of a surface of the semiconductor wafer and the wafer is cut by means of an etching solution applied to the masked surface, the improvement that said semiconductor wafer is made of a material selected from the group consisting of silicon, germanium, gallium arsenide and indium antimonide, and that said masking layer consists of a metal layer of chromium which is vaporized onto said semiconductor wafer.

2. The improvement defined in claim 1, wherein said semiconductor wafer is made of silicon.

3. The improvement defined in claim 1, further comprising the step of removing said masking layer at the termination of said cutting process.

4. The improvement defined in claim 3, wherein said masking layer is removed in dilute hydrochloric acid by activating with zinc.

* * * * *